United States Patent [19]

Faes et al.

[11] Patent Number: 4,657,158
[45] Date of Patent: Apr. 14, 1987

[54] DEVICE FOR FEEDING ELECTRONIC COMPONENTS PACKED IN TAPE TO A PICK-UP POSITION

[75] Inventors: Franciscus C. M. Faes; Josephus M. M. Van Gastel; Jozef G. H. M. Smolders; Hubertus J. Theelen; Petrus A. C. Verberne, all of Eindhoven, Netherlands

[73] Assignee: U.S. Philips Corporation, New York, N.Y.

[21] Appl. No.: 630,563

[22] Filed: Jul. 13, 1984

[30] Foreign Application Priority Data

May 11, 1983 [NL] Netherlands ........................ 8303816

[51] Int. Cl.4 ............................................ G07F 11/66
[52] U.S. Cl. ........................................ 221/25; 221/74; 221/81; 221/197; 221/224

[58] Field of Search ................ 221/25, 69-71, 221/74, 76, 79, 81, 197, 224; 227/107, 135-137

[56] References Cited

U.S. PATENT DOCUMENTS

| | | | |
|---|---|---|---|
| 2,979,726 | 4/1961 | Carlzen et al. | 221/74 X |
| 3,090,521 | 5/1963 | Fazekas | 221/197 X |
| 4,337,864 | 7/1982 | McLean | 221/197 X |
| 4,410,103 | 10/1983 | Fuhrmeister | 221/74 X |

Primary Examiner—Charles A. Marmor
Assistant Examiner—P. McCoy Smith
Attorney, Agent, or Firm—Norman N. Spain

[57] ABSTRACT

A device for feeding electronic components packed in tape to a pick-up position, comprising a housing with a holder or a supply reel, a feeding and locking mechanism, an ejection mechanism, and a wind-up mechanism, which mechanisms are united with the housing into a cassette unit.

8 Claims, 11 Drawing Figures

DEVICE FOR FEEDING ELECTRONIC COMPONENTS PACKED IN TAPE TO A PICK-UP POSITION

BACKGROUND OF THE INVENTION

1. Field of the Invention

The invention relates to a device for feeding electronic components packed in tape to a pick-up position comprising a holder for a supply reel, a feeding and locking mechanism, an ejection mechanism and a wind-up mechanism.

2. Des. of the Prior Art

Devices known hitherto for feeding electronic components packed in tape are composed of separate individual and productdependent mechanical elements, which are mounted as the case may be in combination, but generally separately on the frame of a component mounting device, to which the components are supplied and which serves for further processing and placement of the components. Such known devices are not flexible because upon readjustment to a tape having different dimensions and other components most of the separate mechanical elements have to be exchanged. The range of chip-type components without the conventional comparatively long connection wires and suitable to be surface mounted on substrates devoid of holes becomes gradually wider: the variety in dimensions of the tapes in which the components are packed also increases. This variety of components and tapes results in that a number of specimens of different dimensions of each mechanical element has to be kept on stock. The exchange of the mechanical elements has to take place on the component mounting device itself. Finally, each mechanical element has to be separately adjusted and positioned, which is not conducive to the overall precision of the device and to the reproducibility in processing and placement of the components.

SUMMARY OF THE INVENTION

The invention has for its object to provide a device for feeding electronic components packed in tape, which feeds the components with a high degree of precision and reproducibility to the pick-up position, which device has compact dimensions, comprises a comparatively small number of mechanical elements and can be exchanged rapidly and in a simple manner.

For this purpose, the device according to the invention is characterized by a housing which serves as a common support and which is united with the reel holder, the feeding and locking mechanism, the ejection mechanism and the wind-up mechanism into an exchangeable cassette unit.

By the measures according to the invention, a very compact unit is obtained in which all the required mechanical elements are united with a high degree of precision to a cassette. This cassette has the same advantages as cassettes in general, i.e. standard dimensions, composed of standard components and possibility of rapid and simple exchange. For the further processing of the components to be supplied, the cassette as a whole need only be coupled to another device, for example, a component mounting device, and be positioned with respect to this device. The device according to the invention is also suitable for the adaption to and processing of smaller series of different components and tapes.

It should be noted that the U.S. patent application Ser. No. 399,042, filed July 16, 1982 U.S. Pat. No. 4,494,902 discloses a device for feeding electronic components packed in tape; in this known device, the reel holder on the one hand and the feeding and locking mechanism on the other hand constitute separate units; the wind-up is mouned on the reel holder; moreover, all units are of multiple construction. This device is particularly suitable for processing very large series of the same sequence of electronic components; the rearrangement and the adaptation for processing another sequence of components are time-consuming.

A preferred embodiment of the device according to the invention is characterized in that the housing is provided with a support for a supply reel, with a transport channel constituting a guide for a tape with components to be supplied, with a bearing for a take-up reel, with a sliding mechanism, with a feeding pin, with a locking pin and with an ejection pin. The housing serves as a support for a number of exchangeable mechanical elements specific for a given product, such as transport channel, ejection pin, take-up reel and the like, and is provided to this end with a number of positioning faces. Due to the fact that the housing can be constructed as a standard element, the cost is comparatively low in spite of the required very high accuracy to shape and size. The housing itself is suitable for components and tapes in all dimensions and shapes already existing and still to be expected. By exchange of one or more of the exchangeable product-dependent mechanical elements, the device can be adapted rapidly and in a simple manner to components and tapes of different shapes and dimensions. Due to the fact that all the exchangeable mechanical elements are positioned accurately with respect to the housing, a very accurate all-over positioning is obtained for the further processing of the components fed and supplied soley by mounting and positioning the cassette unit with respect to a component mounting device.

In another preferred embodiment of the device according to the invention, the sliding mechanism comprises a feeding slide and a driving slide, which slides, viewed in the feeding direction, are positively coupled to each other by a shape connection and, viewed in a direction transverse to the feeding direction, are frictionally coupled to each other by a force connection, the feeding pin being secured on the feeding slide and the locking pin being secured on a lever rotatable about a fixed pivot shaft and co-operating with the feeding slide, while the driving slide co-operates with a cam system operative in the feeding direction and consisting of cam tracks and cam followers.

By said measures, the number of essential mechanical elements of the device is limited, as a result of which tolerances and clearances are also limited and the reproducibility is influenced positively. Due to the sliding mechanism, a very compact construction of the device with extremely small dimensions is obtained. The small width of the device is of great practical importance in connection with the further processing and simultaneous placement of a number of electronic components on a substrate; for this purpose, several of the cassette units according to the invention, ten to twenty of these cassettes, depending upon the dimensions of the components and tapes to be processed, have to be arranged within a given area. It has been found in practice that by the said measures a cassette unit can be obtained whose overall maximum with is only 8 mm larger than the width of the tapes to be processed having standard widths of 8, 12, 16, 24 and 32 mm.

In a further preferred embodiment of the device according to the invention, the cam tracks are provided on exchangeable cam plates. The feeding movement of the feeding slide is derived from the driving movement of the driving slide via the cam system; the feeding stroke of the feeding slide and hence of the feeding pin depends upon the profile of the cam tracks. Due to the fact that according to the invention the cam plates with the cam tracks are exchangeable, the device can be rearranged and adapted rapidly and efficiently to a tape in which the electronic components are stored at a different pitch and for whose processing a different feeding stroke is required. In the known standard tapes, the components are located at a pitch equal to a multiple of 4 mm. The cam plates can be secured on the driving slide, whereby the cam followers are fixedly connected to the housing, or conversely.

Another preferred embodiment of the device according to the invention is characterized in that the feeding slide is provided with guides co-operating with the driving slide, the driving slide and the guides being frictionally pressed against each other by a spring. By said measures, a simple coupling between the driving slide and the feeding slide is obtained. The positive feeding movement of the feeding slide is derived from the driving movement of the driving slide via the said cam system and by said coupling; due to the fact that the slide system thus coupled acts as a kind of slip coupling, the maximum force to be transmitted is limited so that disturbances by jamming or by damage of the device or of the tape with the components are avoided. By a suitable choice of the said spring, the maximum frictional force can be influenced.

The driving slide can be driven positively both in the forward stroke and in the backward stroke, for example by a cam, a lever and the like. In an alternative preferred embodiment of the device according to the invention, the driving slide is displaced against the action of the spring during the forward stroke, the backward stroke taking place under the action of the spring, the spring simultaneously pressing the cam tracks and the cam followers against each other.

The device according to the invention becomes even more compact and complete when in a further preferred embodiment, the sliding mechanism is provided with an abutment arm which co-operates with a driving pin for driving the wind-up mechanism. The said arm can be secured either on the driving slide or on the feeding slide.

In a still further preferred embodiment of the device according to the invention, the wind-up mechanism mainly comprises a driving disk on which the driving pin is secured, a friction coupling, a driven disk, a reel rim, a detachable reel flange and a cover plate connected to the housing, a feeding pawl being provided on the driven disk and a locking pawl being provided on the cover plate, which pawls co-operate with a pawl toothing at the inner periphery of the reel rim. By said measures, a very compact construction of the wind-up mechanism is obtained. The mechanism comprises only a single exchange part, i.e. the detachable reel flange. For reconstruction to another type of tape having another width dimension, only the said reel flange need be exchanged.

Due to the fact that in a further preferred embodiment of the device according to the invention the reel holder is pivotally secured on the housing, the reel holder can be swung out and an empty reel can be replaced by a fresh full reel, while the device is in operation and the last part of the tape on the empty reel is processed. When the beginning of the fresh tape is connected to the end of the preceding tape, for example, by means of adhesive tape, the fresh tape can be threaded in without it being necessary to bring the device to a standstill.

The invention will be described more fully with reference to the drawing. In the drawing.

Des. of the preferred Embodiments

Figure 1:
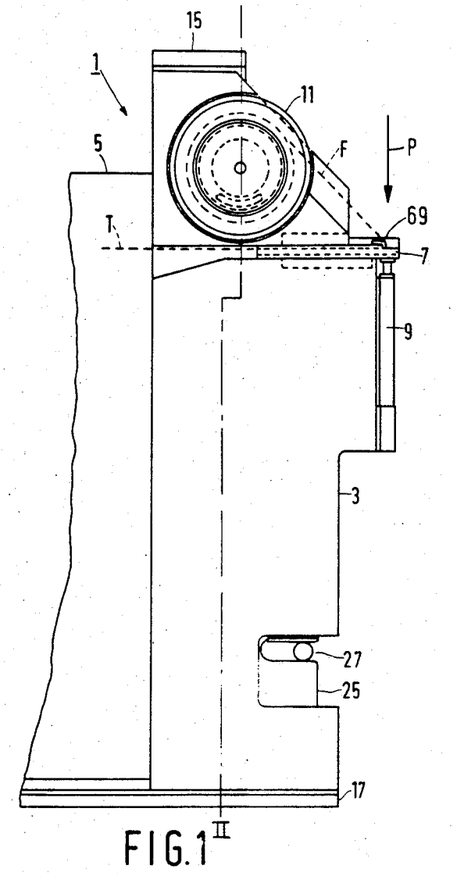
FIG. 1 shows: an embodiment of the device according to the invention in side elevation.
Figure 2:
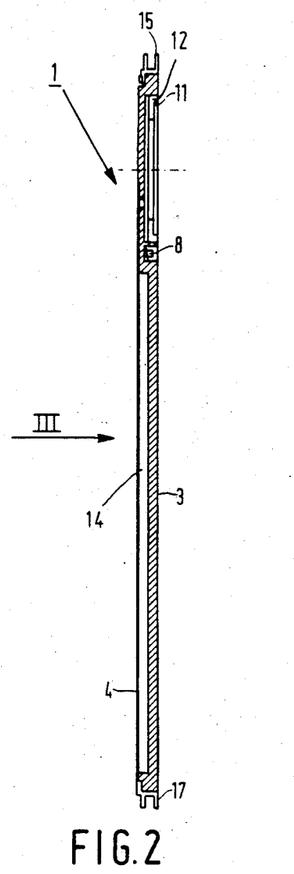
FIG. 2 shows: the device in cross-section taken on the line II—II in FIG. 1.
Figure 3:
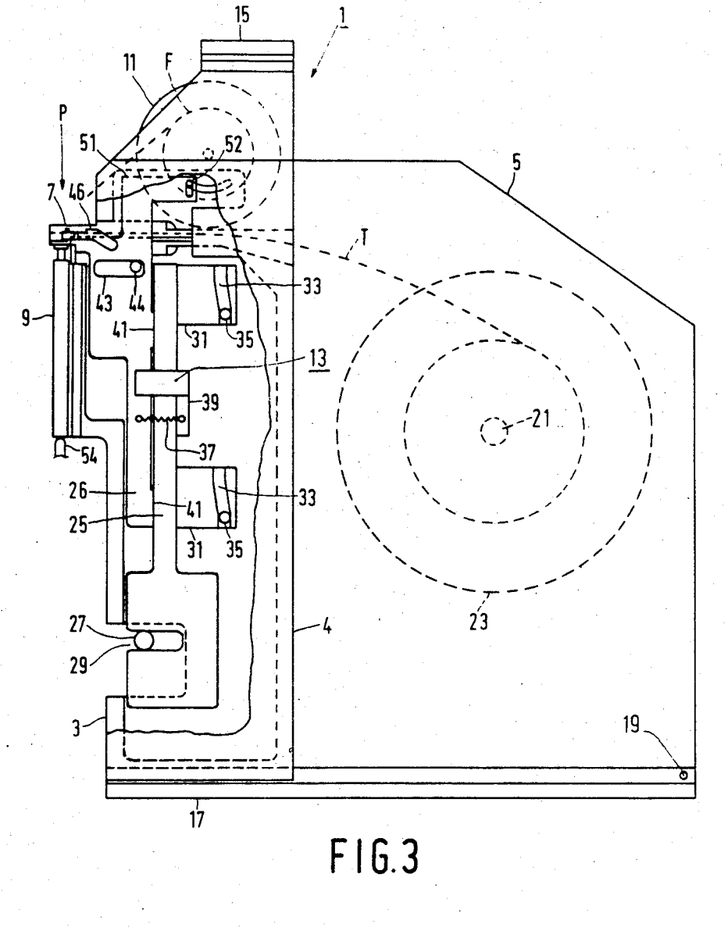
FIG. 3 shows: an elevation of the device taken on the arrow III in FIG. 2, partly broken away.

The device 1 shown in FIGS. 1 to 3 comprises a housing 3 which acts as a basic element and as a support and on which are secured a reel holder 5, a guide 7 for a tape T with electronic components, an ejection mechanism 9 and a wind-up mechanism 11; a feeding and locking mechanism in the form of a sliding mechanism 13 is slidably journalled in a cavity 14 in the housing 3. The said mechanisms are united with the housing to a cassette unit. The device serves for feeding electronic components packed in the tape T to a pick-up position P; the device 1 is coupled for this purpose to another device, such as a component mounting device, which serves for further processing the components supplied in the pick-up position P; the two devices are positioned with respect to each other so that the center line of the ejection mechanism 9 coincides with a center line of a pick-up not shown, which forms part of the component mounting device. The housing 3 is provided on the upper side and on the lower side with reference surfaces on which profiles 15a and 17 are provided, which serve for positioning the cassette unit with respect to the said component mounting device. The reel holder 5 is pivotally arranged on a pivot pin 19, which is secured to the profile 17. Reference numeral 21 denotes a reel shaft which is secured on the reel holder 5 and on which a reel 23 can be journalled. The sliding mechanism 13 mainly consists of a driving slide 25 and a feeding slide 26. The driving slide 25 is displaceable in vertical direction and is driven in a reciprocating movement by means of a lever or a drive roller 27, which co-operates with a slot 29 in the slide. The driving slide 25 is provided with two identical detachable cam plates 31 each provided with a cam track 33 co-operating with fixed cam rollers 35 which act as cam followers and which are secured on the inner wall of the housing 3. By means of a spring 37 and via a clamping block 39, the driving slide 25 is pressed against two guides 41 on the feeding slide 26. The vertical reciprocating driving movement of the driving slide 25 is converted by means of the cam system consisting of the exchangeable cam plates 31 and cam rollers 35 into a horizontal reciprocating feeding movement of the feeding slide 26, which also performs a short reciprocating movement in vertical direction; this vertical stroke of the feeding slide 26 is limited by a slot 43 in the feeding slide co-operating with a fixed cam roller 44. Reference numeral 46 designates a locking lever. The operation of the slides will be described more fully hereinafter.

The guide 7 is provided with a transport channel 8 for feeding and guiding the tape T. The feeding slide 26 has secured on it an abutment arm 51 which co-operates with a driving roller 52 of the wind-up mechanism 11, which serves for pulling off and winding up a cover foil F which closes the cavities in the tape T accommodating the electronic components. The ejection mechanism 9 is also mounted on a reference surface of the housing 3. The ejection mechanism 9 is driven by means of a driving rod 54. The driving rod 54 and the driving roller 27 are preferably coupled to the same drive; at any rate, the driving rod 54 and the driving roller are driven synchronously. The housing 3 is closed on one side by a plate-shaped cover 4.

Figure 4:
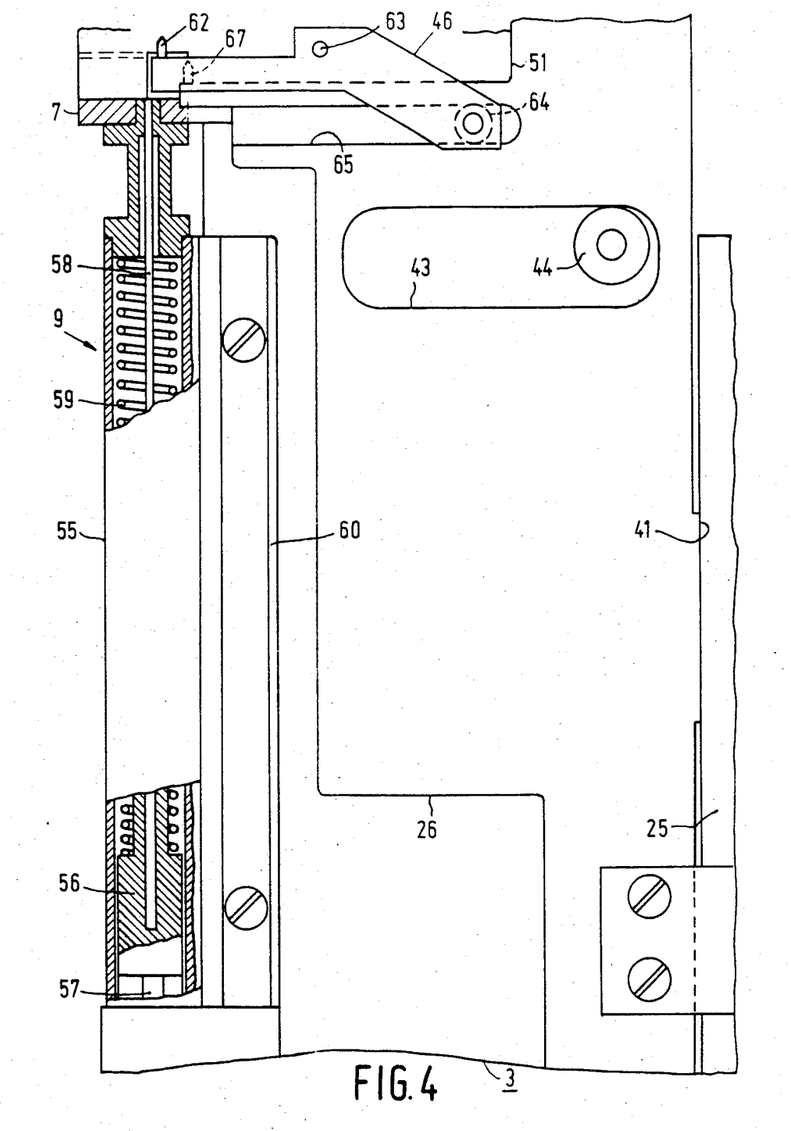
FIG. 4 shows a part of the device shown in FIG. 3 on an enlarged scale.

FIG. 4 shows on an enlarged scale the part of the device comprising the ejection mechanism 9, which mainly consists of a cylindrical housing 55 in which a piston 56 is displaceable, which is connected to a driving pin 57 and is coupled to an ejection pin 58. Reference numeral 59 designates a reset spring. The housing 55 is provided with a mounting part 60 by means of which the ejection mechanism 9 is secured on the housing 3 and is positioned with respect to the housing so that the center line of the ejection pin 58 passes through the center of an opening which is provided in the bottom of the tape T at the center of each cavity. The tape T is aligned in this position in a manner to be described more fully hereinafter by a locking pin 62 which is secured on the locking lever 46. The lever 46 is pivotally journalled on a pivot shaft 63 which is fixedly connected to the housing. Further, the locking lever 46 is provided with a cam roller 64 which co-operates with a groove 65 in the feeding slide 26. Reference numeral 67 denotes a feeding pin which is secured on the feeding slide 26.

Figure 5:
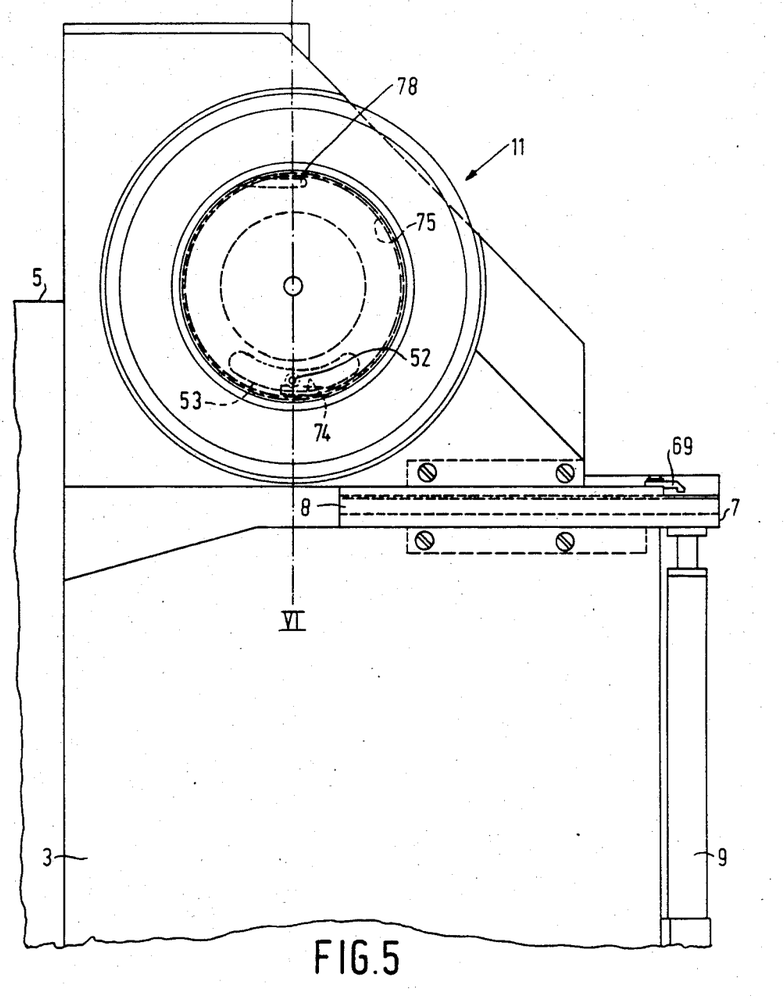
FIG. 5 shows on an enlarged scale a part of the device shown in FIG. 1.

FIG. 5 further shows a guide element 69 which serves to guide the cover foil F to the wind-up mechanism 11.

Figure 6:
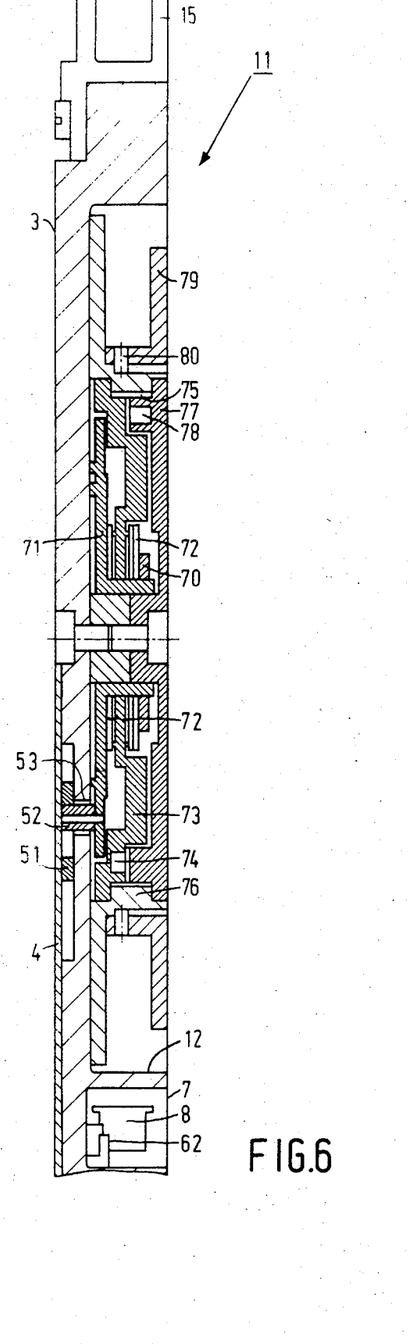
FIG. 6 shows also on an enlarged scale the wind-up mechanism in cross-section.

FIG. 6 shows on an enlarged scale a sectional view of the wind-up mechanism 11 which is mounted in a cavity 12 of the housing 3. The aforementioned driving roller 52 which is driven in a reciprocating movement by the abutment arm 51 on the feeding slide 26, is connected via an arcuate opening 53 in the wall of housing 3 to a driving disk 71. By means of friction plates 72, the driving disk 71 co-operates with a driven wheel 73 which is provided with a feeding pawl 74 which co-operates with a pawl toothing 75 at the inner periphery of a reel rim 76. These rotating parts of the wind-up mechanism are covered by a non-rotating cover plate 77, which is fixedly connected to the housing 3 and which is provided with a latch pawl 78, which also co-operates with the pawl toothing 75. A reel flange 79 is connected by means of a bayonet joint 80 to the reel rim 76 and constitutes the exchange part of the reel and of the wind-up mechanism. Via the driving roller 52, the driving disk 71 is set into an oscillating movement and drives via the friction plates 72 the wheel 73. By means of the feeding pawl 74 and the pawl toothing 75, the reel rim 76 is rotated step by step and is held after each step in the new position by the latch pawl 78. By the stepwise rotation of the reel rim 76, the covering foil F is pulled off the tape T, is guided via the guide element 69 to the reel 76, 79 and is wound up. The maximum torque to be transmitted via the friction plates 72 to the reel rim is adjusted by means of an adjustment nut 70 in such a manner that with an increasing diameter of the reel filling the coupling begins to slip in order to avoid that the covering foil F is torn.

FIGS. 7a, 7b, 7c and 7d show the positions of the feeding pin 67 and the locking pin 62 at successive stages of a cycle. For the sake of clarity, the tape T is shown diagrammatically in plan view with the cavities A, B, C and D and with the sprocket holes a, b, c, d, and e which are located at a pitch R, in practice of 4 mm: the cavities in the tape T are each provided with a central opening O, whose center is located in line with the accurately positioned ejection pin 58. The distance between successive components corresponds to the pitch S between two successive openings O which is a multiple of pitch R. The feeding stroke to be performed by the feeding slide is equal to the pitch S. Because the pivot shaft 63 of the locking lever 46 is fixedly secured to the housing, the pivot shaft 63, the locking pin 62 and the ejection pin 58 are accurately positioned with respect to each other. The center line H—H of the ejection pin 58 is taken as reference.

Figure 7A:
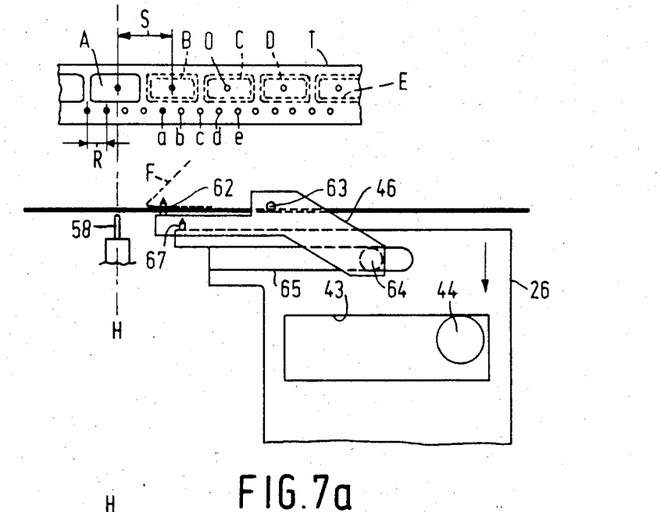
FIGS. 7a, 7b, 7c and 7d show diagrammatically the feeding slide in successive positions.

FIG. 7a shows the situation after the feeding stroke has been performed, the relevant component E has been removed from the cavity A and the backward stroke of the feeding slide 26 has started. The tape T is indexed with respect to the ejection pin 58 due to the fact that the locking pin 62 has come into engagement with the sprocket hole a as a result of a rotary movement of the lever 46 about the pivot shaft 63; the rotary movement of the lever 46 takes place due to the fact that during a small initial downward movement of the feeding slide 26 the roller 64 on the lever 46 co-operates with the groove 65 in the feeding slide 26. The feeding slide 26 is taken along by frictional force in the downward movement of the driving slide until the slot 43 in the feeding slide engages by the upper side the fixed cam roller 44. In the situation shown, the cavities B, C and D are still closed by the cover foil F.

Figure 7B:
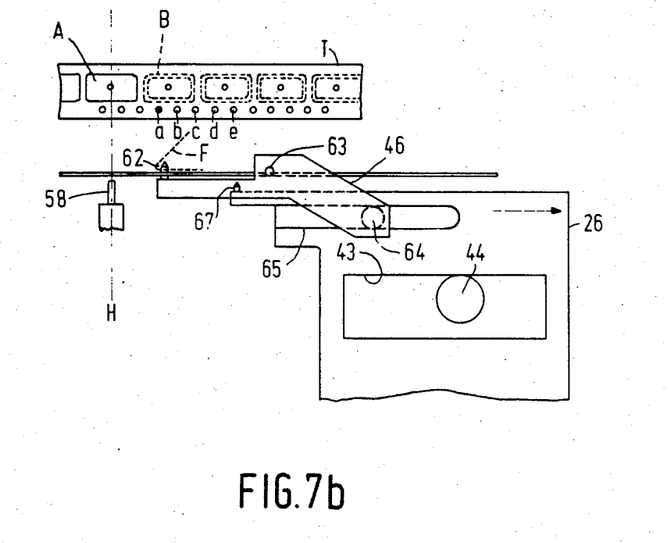

FIG. 7b shows the situation in which the feeding slide 26 performs a backward stroke in horizontal direction after the short downward stroke shown in FIG. 7a and as a result of the further downward movement of the driving slide 25. The tape T remains indexed in the same position with the locking pin 62 still in engagement with the same sprocket hole a.

Figure 7C:
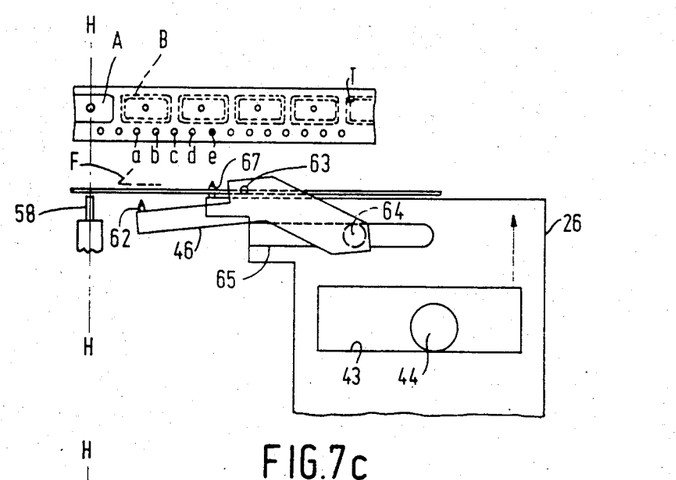

FIG. 7c shows the situation at the beginning of the driving stroke by the driving slide which takes along the feeding slide 26 in a short upward stroke unitl the cam roller 44 comes into engagement with the lower side of the slot 43; as a result of this movement of the feeding slide 26 the lever 46 rotates counter-clockwise about the pivot shaft 63 and the locking pin 62 is disengaged from the sprocket hole a; however, in the meantime the feeding pin 67 has come into engagement with the sprocket hole 3 so that the tape T remains under control.

Figure 7D:
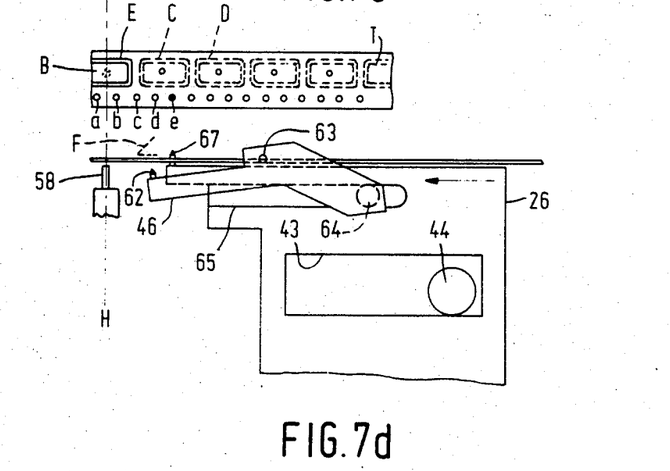

FIG. 7d finally shows the situation towards the end of the feeding storke. The tape T is transported further by the feeding pin 67 over a feeding distance equal to the pitch S between the two successive openings O, in the embodiment shown equal to thrice the pitch R between the sprocket holes. The cavity B is now located with the opening O in line with the center line H—H of the ejection pin 58. In this situation, the tape T is indexed by the feeding pin 67. The feeding slide 26 has reached the point of reversal and stops for a short time; the locking lever 46 also stops. During the feeding stroke, also the covering foil F is pulled so far off the tape T that the cavity B is open and the component E located therein is accessible. In this situation, the component is removed from the cavity.

As soon as the feeding slide 26 taken along by the driving slide starts again the short downward stroke, the locking lever 46 is rotated clockwise so that the locking pin 62 comes into engagement with the sprocket hole d, while the feeding pin 67 is disengaged from the sprocket hole 3. The situation shown in FIG. 7a is reached again, in which the tape T with the cavity B is located above the ejection pin 58. In this situation component E can be picked-up from cavity B.

The various components are constructed, proportioned, mutually adapted and synchronized with each other in such a manner that the tape T always remains under control, that is to say that either the locking pin 62 or the feeding pin 67 is in engagement with one of the sprocket holes. For these reasons, the two pins never come into engagement with the same transport hole. During the transfer of the tape indexing from one pin to the other, overlap always occurs, the two pins then being simultaneously in engagement with a sprocket hole. The movements of the mechanical elements are adjusted in such a manner that no transport of the tape takes place when a cavity with a component present therein is open.

Figure 8:
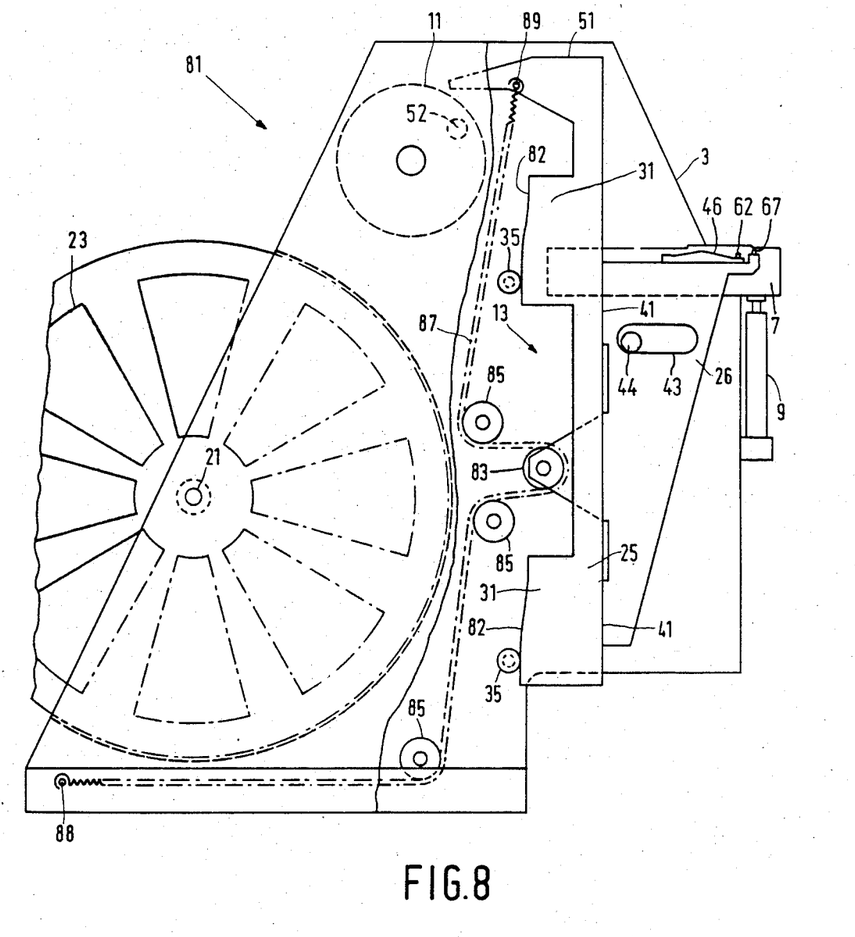
FIG. 8 is a side elevation, partly broken away, of another embodiment of the device according to the invention.

An alternative embodiment of the device according to the invention is shown in FIG. 8, in which elements comparable with those of the first embodiment are designated by the same reference numerals. The device 81 shown comprises also a housing 3 provided with a guide 7 for feeding a tape with electronic components from a reel 23 journalled on a reel shaft 21 in the housing. There are further secured on the housing 3 an ejection mechanism 9, a wind-up mechanism 11 and a lever 46 with a locking pin 62. The housing accommodates a sliding mechanism 13 consisting of a driving slide 25 and a feeding slide 26 with a feeding pin 67. The driving slide 25 is provided with two identical cam plates 31 each co-operating via a cam track 82 with a fixed cam roller 35. In this embodiment, the abutment arm 51 cooperating with a driving roller 52 for driving the wind-up mechamism 11 is secured on the driving slide 25. The feeding slide is provided with a slot 43 co-operating with a cam roller 44 on the housing for limiting the vertical stroke of the feeding slide. Further, the feeding slide is provided with two guides 41 for the driving slide and with a guide roller 83. Three further guide rollers 85 are also journalled in the housing 3. An elongate spring 87, one end of which is connected to the housing 3 via a pin 88 and the other end of which is secured via a pin 89 on the abutment arm 51, is passed over the guide rollers 83 and 85 in such a manner that the feeding slide 26 with the guides 41 is pressed against the driving slide and the driving slide is pressed with the cams 82 against the cam rollers 35. In this embodiment, the driving slide 25 is driven only in the forward upward stroke against the action of the spring 87; the backward stroke of the driving slide 25 takes place under the action of the spring 87. In the embodiment shown, the wind-up mechanism 11 is driven by the abutment arm 51 upon the backward stroke of the driving slide 25, against the action of a spring not shown.

Product tapes, which have the same width, it is true, but in which the electronic components are enclosed at different pitches, require a different feeding stroke. A minimum readjustment is required for such an adaptation of the cassette unit according to the invention. Only the cam plates 31 have to be exchanged for cam plates which convert the driving stroke of the driving slide 25 into the desired feeding s troke of the feeding slide 26. The sliding mechanism 13 is readily accessible by simply removing the cover 4. If the cam plates 31 are integral with the driving slide 25, the whole driving slide is exchanged.

A further readjustment is required for the adaptation of the cassette unit to product tapes with varous tape widths; the guiding profiles 15 and 17, the ejection mechanism 9 as a whole, the guide 7 for the tape and the exchangeable reel flange 79 of the wind-up mechanism 11 have to be exchanged.

As already set out above, a number of standard tapes with standard dimensions have been developed for packing electronic chiptype components; the pitch of the sprocket holes is 4 mm; the distance between successive components and hence the required feeding stroke is equal to a multiple of 4 mm: the widths of the packing tape increases from 8 mm via a sequence of 12, 16 and 24 mm to 32 mm. Taking the said standard dimensions into account, the stock of mechanical elements can remain limited, especially if extreme dimensions which are hardly usual are left out of consideration, at least by the user.

The flexibility of the cassette unit according to the invention has been clearly demonstrated. An element which intentionally is not integrated in the cassette is a cutting device for cutting the empty tape into pieces. Since such a cutting device does not require an accurate arrangement and positioning, it seems recommendable not to combine the cutting device with the precision cassette according to the invention.

In the embodiment described the components are supplied in a tape, the cavities of which each are provided with a central opening; as in this case the ejection pin 58 has not to perforate the bottom of the cavities, the free end of the ejection pin is blunt and is provided with an end face. However the components may also be supplied in a tape which is devoid of orifices in the bottom of the cavities; as in this case the ejection pin 58 has to perforate the bottom of the cavities, the free end of the ejection pin 58 is pointed.

The different parts of the cassette unit may be made in any convenient material like metal, especially light metal alloy or synthetic resin; the parts may be manufactured by the most economic proces, like injection moulding.

What is claimed is:

1. A device for feeding electronic components packed in a tape to a pick-up position, said device being an exchangeable cassette and comprising:
   (a) a supply reel for said tape,
   (b) a holder for said supply reel,
   (c) a feeding mechanism provided with a feeding pin and coupled to said supply reel for moving said components to said pick-up position,
   (d) a locking mechanism provided with a locking pin coupled to said supply reel for preventing undesired rotation of said tape, (e) an ejection mechanism provided with an injection pin and coupled to said feeding mechanism for ejecting components from said tape at said pick-up position, (f) a wind-up mechanism coupled to said supply reel for guiding said tape along a path coinciding with said pick-up position, (g) sliding mechanism coupled to said feeding mechanism and said wind-up mechanism for driving said feeding and said wind-up mechanism, (h) and a housing secured to and providing a common support for said holder, and said mechanism and supplied with a support for said supply reel, a transport channel constituting a guide for said tape with said components to said pick-up position and a bearing for a take-up reel.

2. A device as claimed in claim 1, characterized in that the sliding mechanism comprises a feeding slide and a driving slide, which slides, viewed in the feeding direction, are positively coupled to each other by a shape connection and, viewed in a direction transverse to the feeding direction, are frictionally coupled to each other by a force connection, the feeding pin being secured on the feeding slide and the locking pin being secured on a lever rotatable about a fixed pivot shaft and co-operating with the feeding slide, while the driving slide co-operates with a cam system operative in the feeding direction and consisting of cam tracks and cam followers.

3. A device as claimed in claim 2, characterized in that the cam tracks are provided on exchangeable cam plates.

4. A device as claimed in claim 2 or 3, characterized in that the feeding slide is provided with guides co-operating with the driving slide, the driving slide and the guides being pressed against each other by a spring.

5. A device as claimed in claim 4, characterized in that the driving slide is displaced during the forward stroke against the action of the spring, the backward stroke taking place under the action of the spring, the spring simultaneously pressing the cam tracks and the cam followers against each other.

6. A device as claimed in claim 1, characterized in that the sliding mechanism is provided with an abutment arm which co-operates with a driving pin for driving the wind-up mechanism.

7. A device as claimed in claim 6, characterized in that the wind-up mechanism mainly comprises a driving disk on which the driving pin is secured, a friction coupling, a driven disk, a reel rim, a detachable reel flange and a cover plate connected to the housing, a feeding pawl being provided on the driven disk and a locking pawl being provided on the cover plate, which pawls co-operate with a pawl toothing at the inner periphery of the reel rim.

8. A device as claimed in claim 1, characterized in that the reel holder is pivotally secured on the housing.

* * * * *